(12) United States Patent
Lee et al.

(10) Patent No.: US 9,297,519 B2
(45) Date of Patent: Mar. 29, 2016

(54) DISPLAY APPARATUS

(71) Applicant: LG ELECTRONICS INC., Seoul (KR)

(72) Inventors: Kyungjoon Lee, Seoul (KR); Uihyung Lee, Seoul (KR); Juyoung Joung, Seoul (KR); Wondo Kee, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 169 days.

(21) Appl. No.: 14/013,427

(22) Filed: Aug. 29, 2013

(65) Prior Publication Data

US 2014/0307421 A1 Oct. 16, 2014

(30) Foreign Application Priority Data

Apr. 15, 2013 (KR) .................. 10-2013-0040735

(51) Int. Cl.
| | |
|---|---|
| *F21V 13/04* | (2006.01) |
| *G02B 19/00* | (2006.01) |
| *G02F 1/1335* | (2006.01) |
| *H01L 33/58* | (2010.01) |

(52) U.S. Cl.
CPC ............ *F21V 13/04* (2013.01); *G02B 19/0028* (2013.01); *G02B 19/0061* (2013.01); *G02B 19/0071* (2013.01); *G02F 1/133603* (2013.01); *G02F 1/133606* (2013.01); *G02F 2001/133607* (2013.01); *H01L 33/58* (2013.01)

(58) Field of Classification Search
CPC  F21V 13/04; G02B 19/0028; G02B 19/0061; G02B 19/0071; G02F 1/133603; G02F 1/133606; G02F 2001/133607; H01L 33/58
USPC .......... 345/83, 102; 362/97.3, 227–248, 308, 362/309, 311.01
See application file for complete search history.

(56) References Cited

U.S. PATENT DOCUMENTS

| | | | | |
|---|---|---|---|---|
| 4,907,044 | A * | 3/1990 | Schellhorn et al. | ............. 257/98 |
| 6,814,475 | B2 * | 11/2004 | Amano | ......................... 362/487 |
| 7,322,721 | B2 * | 1/2008 | Noh et al. | ..................... 362/327 |
| 7,422,347 | B2 * | 9/2008 | Miyairi et al. | ................ 362/335 |
| 7,524,098 | B2 * | 4/2009 | Vennetier et al. | ............. 362/555 |
| 7,582,913 | B2 * | 9/2009 | Huang et al. | .................... 257/98 |

(Continued)

FOREIGN PATENT DOCUMENTS

| | | |
|---|---|---|
| KR | 10-2012-0011185 A | 2/2012 |
| WO | WO 2012/132872 A1 | 10/2012 |

OTHER PUBLICATIONS

European Search Report issued in Application No. 13003645.2 dated Oct. 31, 2014.

*Primary Examiner* — Dmitriy Bolotin
(74) *Attorney, Agent, or Firm* — Ked & Associates, LLP

(57) ABSTRACT

Provided is a display apparatus. The display apparatus may include a display panel and a backlight provided adjacent the display panel. The backlight may include an optical sheet provided adjacent the display panel, a reflector provided a prescribed distance from the optical sheet, at least one light emitting device provided adjacent the reflector, and a lens provided over a corresponding the light emitting device. The lens may include a lower recess formed on a bottom surface of the lens and provided a prescribed distance over the light emitting device, and an upper recess formed on a top surface of the lens and provided to vertically overlap the bottom recess. The lower recess may include an upper surface that extends from the side surface and having a prescribed shape and curvature. The upper recess may also include a lower surface having a prescribed shape and curvature.

19 Claims, 9 Drawing Sheets

(56) References Cited

U.S. PATENT DOCUMENTS

| | | | |
|---|---|---|---|
| 7,585,083 B2* | 9/2009 | Kim et al. | 362/97.3 |
| 7,787,073 B2* | 8/2010 | Bang | 349/62 |
| 7,810,962 B2* | 10/2010 | Tahmosybayat | 362/329 |
| 7,883,232 B2* | 2/2011 | Bang | 362/97.3 |
| 7,982,709 B2* | 7/2011 | Sekiguchi et al. | 345/102 |
| 8,106,859 B2* | 1/2012 | Ohkawa et al. | 345/82 |
| 8,622,594 B2* | 1/2014 | Ishio et al. | 362/455 |
| 8,944,641 B2* | 2/2015 | Kasai | 362/297 |
| 2005/0001537 A1* | 1/2005 | West et al. | 313/500 |
| 2006/0083003 A1* | 4/2006 | Kim et al. | 362/327 |
| 2007/0047261 A1* | 3/2007 | Thompson et al. | 362/623 |
| 2007/0109779 A1* | 5/2007 | Sekiguchi et al. | 362/249 |
| 2009/0296388 A1* | 12/2009 | Wu et al. | 362/235 |
| 2010/0302786 A1* | 12/2010 | Wilcox et al. | 362/327 |
| 2011/0044022 A1* | 2/2011 | Ko et al. | 362/84 |
| 2011/0127903 A1* | 6/2011 | Yao et al. | 313/498 |
| 2012/0300456 A1* | 11/2012 | Phillips et al. | 362/245 |
| 2013/0027946 A1* | 1/2013 | Tseng et al. | 362/294 |
| 2013/0050588 A1* | 2/2013 | Kamada | 348/739 |
| 2013/0070165 A1* | 3/2013 | Shimizu | 348/739 |
| 2014/0063801 A1 | 3/2014 | Seki et al. | |

* cited by examiner (a)  (b)

(a) (b) (c)

(a) (b)

DISPLAY APPARATUS

CROSS-REFERENCE TO RELATED APPLICATION(S)

This application claims priority under 35 U.S.C. §119 to Korean Application No. 10-2013-0040735 filed in Korea on Apr. 15, 2013, whose entire disclosure is hereby incorporated by reference.

BACKGROUND

1. Field

The present disclosure relates to a display apparatus.

2. Background

As an information-oriented society develops, needs for diverse forms of display apparatuses are increasing. Accordingly, research has been carried out on various display apparatuses such as liquid crystal display devices (LCDs), plasma display panels (PDPs), electro luminescent displays (ELDs), vacuum fluorescent displays (VFDs), and the like, which have been commercialized.

Among these, a liquid crystal panel of a liquid crystal display (LCD) includes a liquid crystal layer, TFT substrates facing each other with the liquid crystal layer therebetween, and a color filter substrate. The liquid crystal panel may use light supplied from a backlight unit to display an image because it does not emit light.

A backlight unit using an isotropic lens has a structure in which light sources are arranged in an orthogonal or honeycomb structure, and the lens disperses light emitted from the light sources in a form of isotropic light distribution. In such a structure, since the pitch between the light sources increases as the number of light sources is reduced, it is difficult to disperse light in the form of circular isotropic light distribution using a secondary lens.

The above references are incorporated by reference herein where appropriate for appropriate teachings of additional or alternative details, features and/or technical background.

BRIEF DESCRIPTION OF THE DRAWINGS

The embodiments will be described in detail with reference to the following drawings in which like reference numerals refer to like elements wherein.

DETAILED DESCRIPTION

Figure 1:
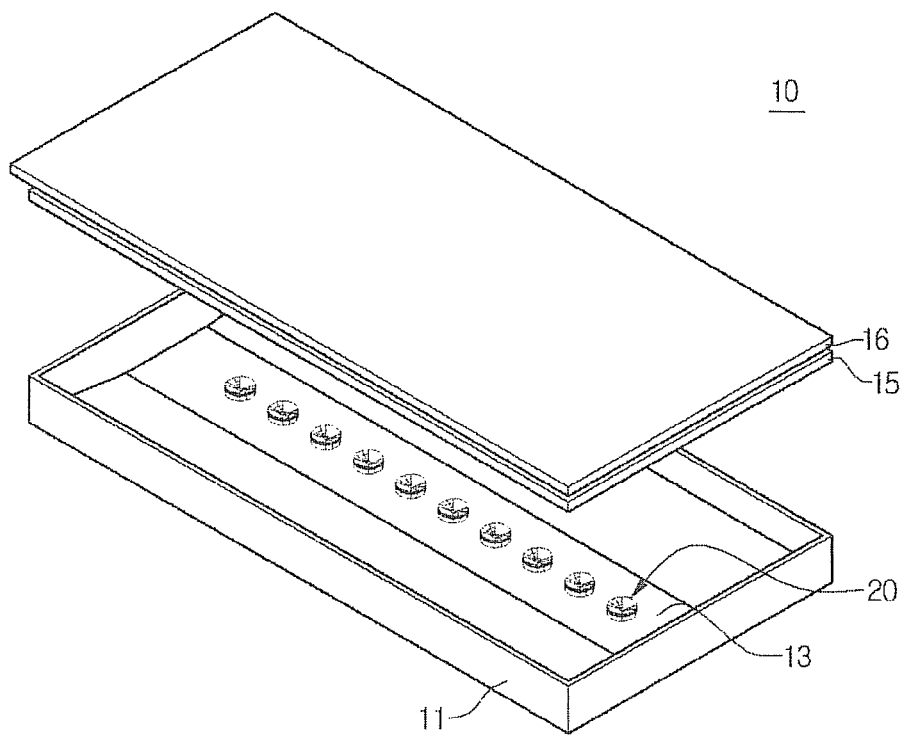
FIG. 1 is an exploded perspective view illustrating a structure of a display apparatus according to an embodiment.

In the following detailed description of the preferred embodiments, reference is made to the accompanying drawings that form a part hereof, and in which is shown by way of illustration specific preferred embodiments in which the disclosure may be practiced. These embodiments are described in sufficient detail to enable those skilled in the art to practice the disclosure, and it is understood that other embodiments may be utilized and that logical structural, mechanical, electrical, and chemical changes may be made without departing from the spirit or scope of the disclosure. To avoid detail not necessary to enable those skilled in the art to practice the disclosure, the description may omit certain information known to those skilled in the art. The following detailed description is, therefore, not to be taken in a limiting sense, and the scope of the present disclosure is defined only by the appended claims.

Exemplary embodiments of the present disclosure will now be described with reference to the accompanying drawings. Embodiments may, however, be embodied in different forms and should not be constructed as limited to the embodiments set forth herein. Rather, these embodiments are provided so that this disclosure will be thorough and complete, and will fully convey the scope of the present disclosure to those skilled in the art. In the drawings, the thicknesses of layers and regions are exaggerated for clarity.

Embodiments provide a display apparatus which may include an optical assembly which is capable of improving quality of a displayed image. Embodiments also provide a display apparatus which is capable of realizing a surface light source structure through anisotropic light distribution.

Figure 2:
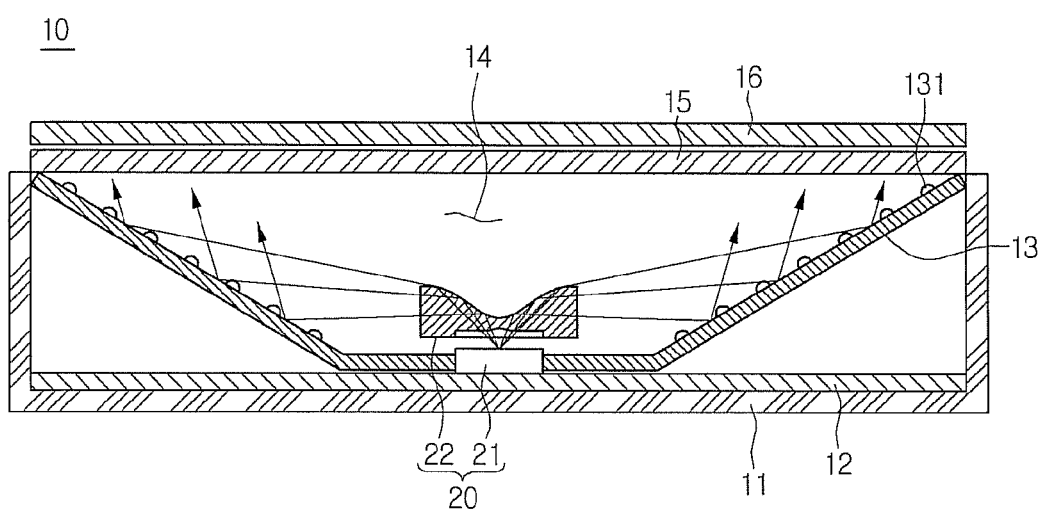
FIG. 2 is a cross-sectional view of the display apparatus.

FIG. 1 is an exploded perspective view illustrating a structure of a display apparatus according to an embodiment, and FIG. 2 is a cross-sectional view of the display apparatus.

Referring to FIGS. 1 and 2, a display apparatus 10 according to an embodiment includes a display panel 16 displaying an image, a backlight unit disposed at a rear side of the display panel 16 to emit light toward the display panel 16, and an optical sheet 15 diffusing or processing the light emitted from the backlight unit.

In detail, the optical sheet 15 includes a diffusion sheet and a prism sheet. Also, the backlight unit may include an LED as a light source. Here, the backlight unit includes a top view type LED package in which light emitted from the light source is oriented toward the display panel 16.

The backlight unit includes a board layer 12 placed on the bottom of a panel case 11, light emitting parts 20 mounted on the board layer 12, and a reflective layer 13 placed on a top surface of the board layer 12.

In detail, the light emitting parts 20 may be arranged in a line at a predetermined distance on a central portion of the reflective layer 13. Also, a portion of the reflective layer 13 corresponding to both side areas of the reflective layer 13 with respect to the light emitting parts 20 may have an upwardly inclined surface. Since the portion of the reflective layer 13 is inclined, light emitted from the light emitting parts 20 and then refracted toward the reflective layer 13 may be reflected toward the optical sheet 15 to improve light efficiency. Also, a reflective pattern or a light extraction pattern 131 may be disposed on a top surface of the reflective layer 13. The light emitted from the light emitting parts 20 may collide with the pattern and thus be reflected toward the display panel 16.

The board layer 12 may be a printed circuit board (PCB) formed of one of polyethylene terephthalate, glass, polycarbonate, or silicon. Alternatively, the board layer 12 may be provided in a film type.

Each of the light emitting parts 20 may include a light emitting device 21 including an LED and a lens 22 coupled to an upper portion of the light emitting device 21. The light emitting device 21 may be the top view type LED package in which a light emitting surface faces an upper side. Thus, light may be emitted upward at a viewing angle of about 120 degrees. Also, most of light emitted from the light emitting device 21 may be totally reflected in a lateral direction by the lens 22. Thus, since the lens 22 is disposed above the light emitting device 21, the backlight unit may decrease in thickness and improve light efficiency and luminance uniformity.

Also, a light guide layer 14 is disposed between the reflective layer 13 and the optical sheet 15. The light guide layer 14 may be filled with air or maintained in a vacuum state.

Hereinafter, a structure of the light emitting part according to embodiments will be described in detail.

Figure 3:
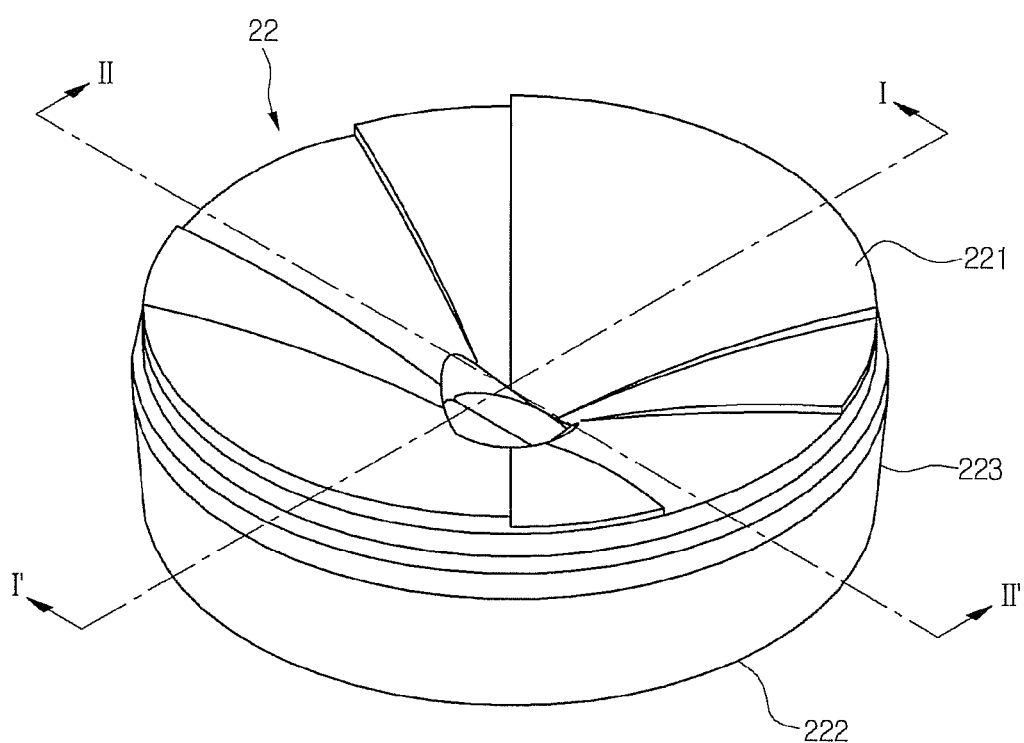
FIG. 3 is a perspective view illustrating an outer appearance of a lens constituting a light emitting part according to an embodiment.
Figure 4:
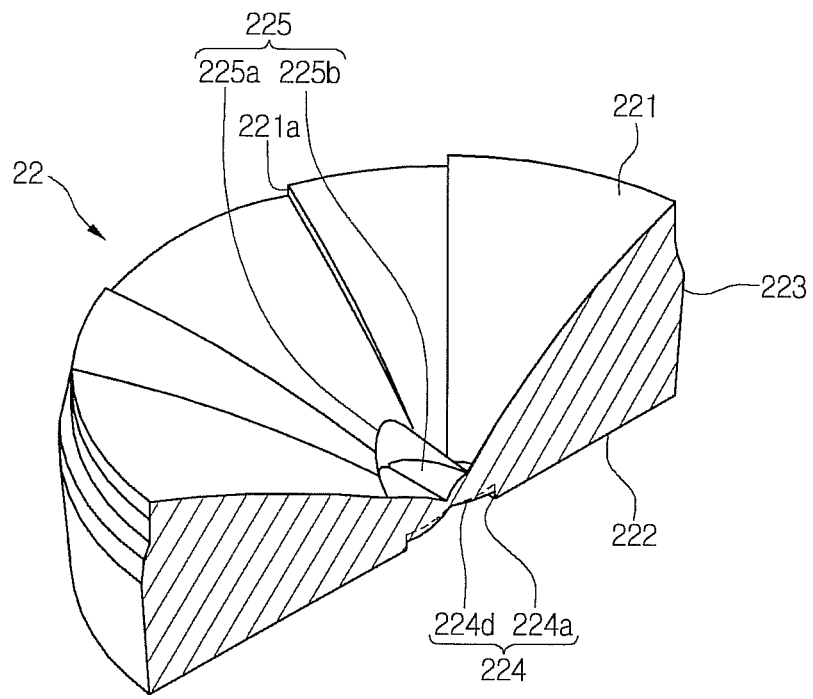
FIG. 4 is a perspective cross-sectional view of the lens according to an embodiment, taken alone line I'-I of FIG. 3.
Figure 5:
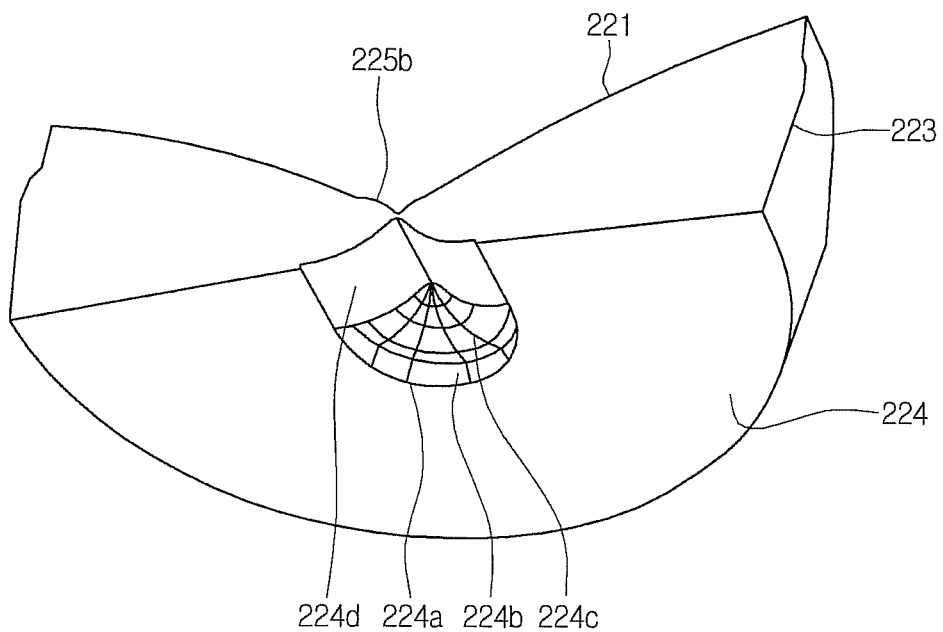
FIG. 5 is a bottom perspective cross-sectional view of the lens according to an embodiment, taken along line I'-I of FIG. 3.
Figure 6:
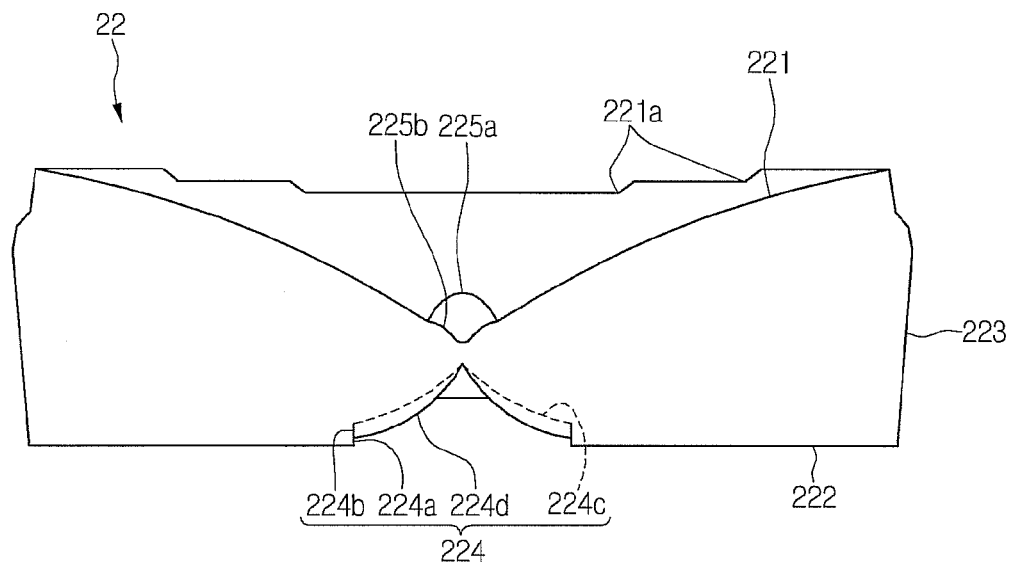
FIG. 6 is a cross-sectional view of the lens according to an embodiment, taken alone line I'-I of FIG. 3.
Figure 7:
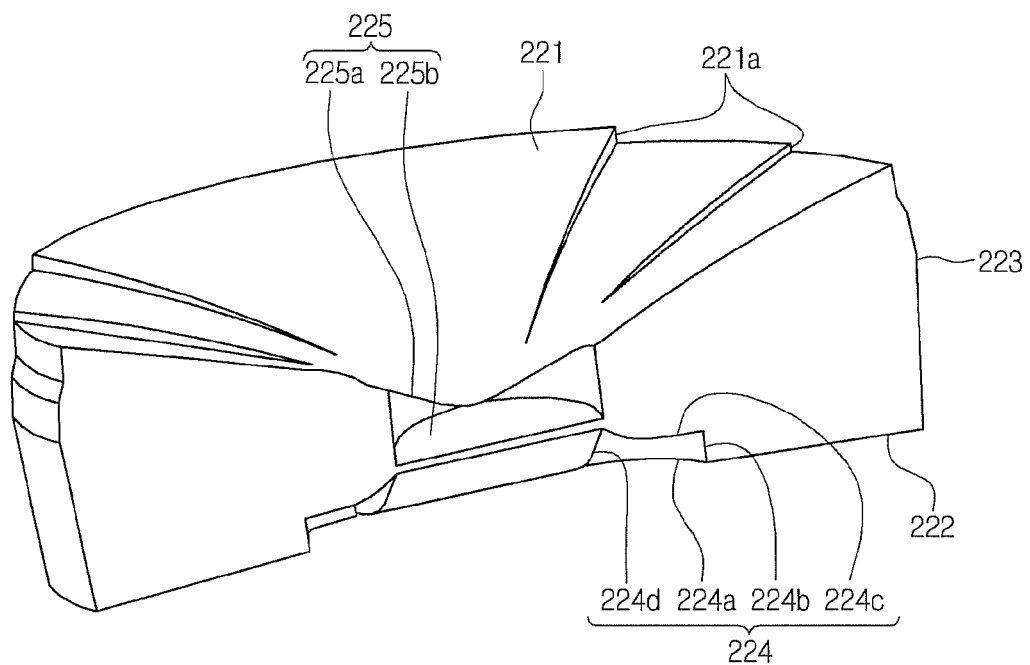
FIG. 7 is a perspective cross-sectional view of the lens according to an embodiment, taken alone line II-II' of FIG. 3.
Figure 8:
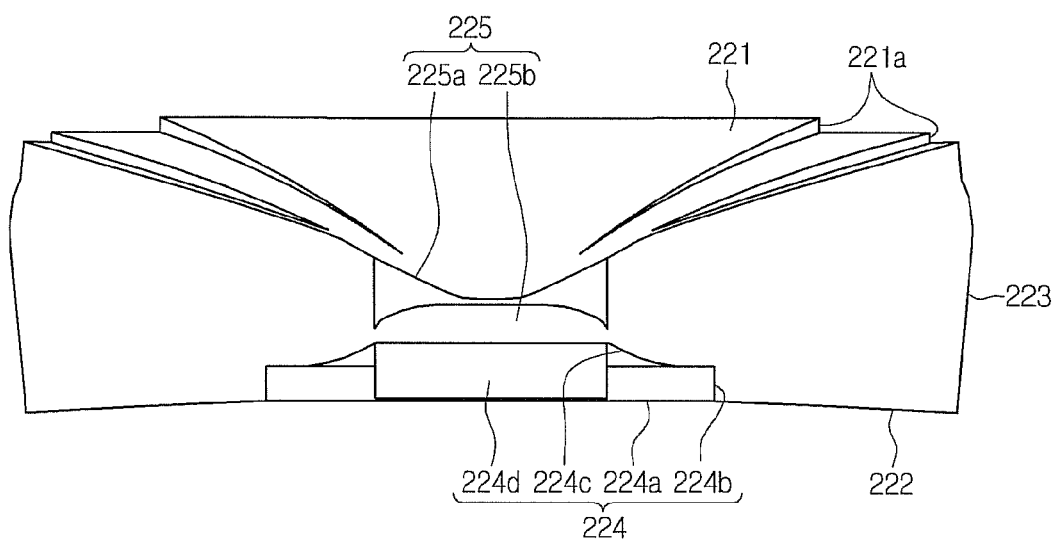
FIG. 8 is a cross-sectional view of the lens according to an embodiment, taken alone line II-II' of FIG. 3.
Figure 9:
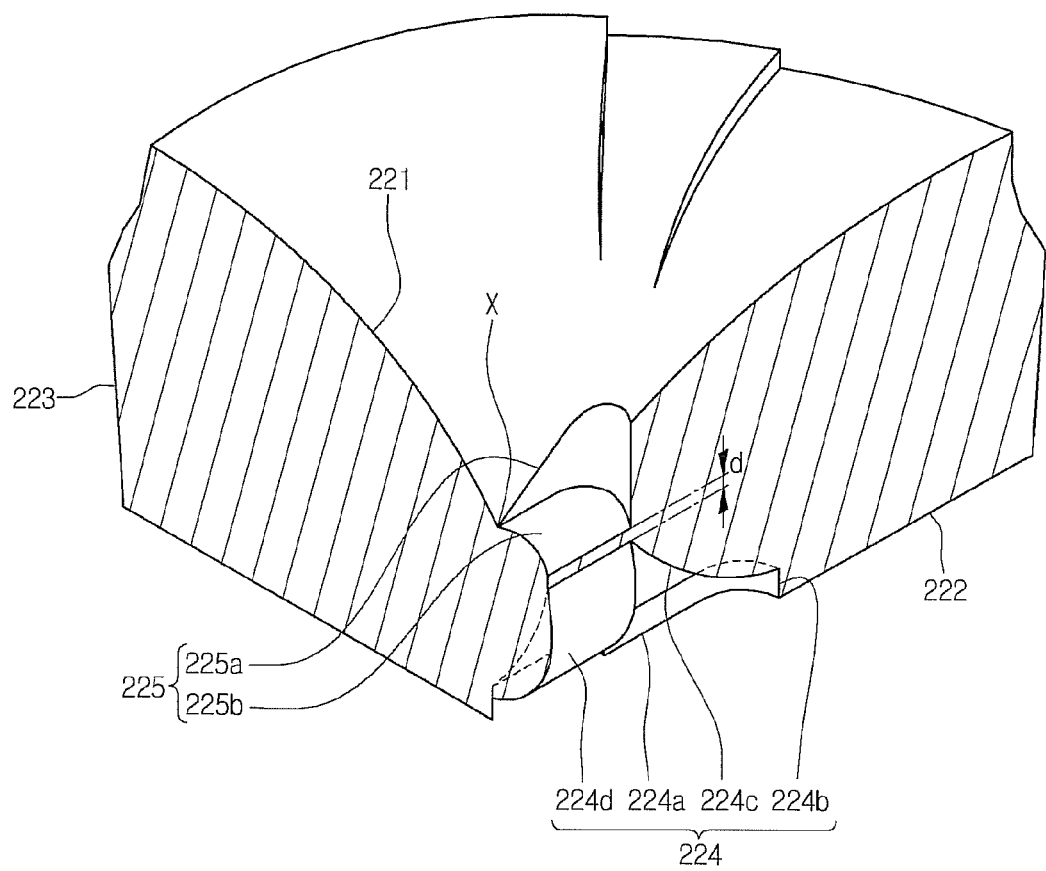
FIG. 9 is a perspective cross-sectional view of the lens according to an embodiment, taken alone lines I-I' and II-II' of FIG. 3.

FIG. 3 is a perspective view illustrating an outer appearance of a lens constituting a light emitting part according to an embodiment, FIG. 4 is a perspective cross-sectional view of the lens according to an embodiment, taken alone line I'-I of FIG. 3, FIG. 5 is a bottom perspective view of the lens according to an embodiment, taken along line I'-I of FIG. 3, FIG. 6 is a cross-sectional view of the lens according to an embodiment, taken alone line I'-I of FIG. 3, FIG. 7 is a perspective cross-sectional view of the lens according to an embodiment, taken alone line II-II" of FIG. 3, FIG. 8 is a cross-sectional view of the lens according to an embodiment, taken alone line II-II" of FIG. 3, and FIG. 9 is a perspective cross-sectional view of the lens according to an embodiment, taken alone lines I'-I and II-II' of FIG. 3.

Referring to FIGS. 3 to 9, the light emitting part 20 according to an embodiment includes the light emitting device 21 and the lens 22 disposed above the light emitting device 21. The lens 22 may be a secondary lens disposed above a primary lens disposed on a top surface of the light emitting device 21.

In detail, the lens 22 may have a concentric shape in cross-section. Also, the lens 22 may have a cylindrical shape having a predetermined height. In more detail, the lens 22 includes a bottom surface portion 222 covering the light emitting device 21, seated on the board layer 12, and having a concentric shape, a side surface portion 223 extending upward from the bottom surface portion 222 by a predetermined length and having a cylindrical shape, and a top surface portion 221 having an aspheric curvature having a parabolic shape on an upper end of the side portion 223 and gradually recessed toward a central direction of the lens 22. The top surface portion 221 may be divided in a plurality of sections in a circumferential direction. A boundary portion between the adjacent sections may be stepped upward or downward. Light emitted upward from the light emitting device 21 may collide with the top surface portion 221 and thus be totally reflected in a lateral direction. Also, one portion of the totally reflected light may advance in the lateral direction, and the other portion of the light may collide with the reflective layer 13 and thus be re-reflected. Here, the more a distance between the light emitting device 21 and the top surface portion 221 decreases, the more a distance between the light emitting device 21 and a point at which light collides with the reflective layer 13 decrease because a total reflection angle decreases. Thus, when the stepped portion is provided to cause a height difference of the top surface portion 221, the light emitted onto the top surface portion 221 and then totally reflected may be re-reflected on several points of the reflective layer 13. That is, the totally reflected light may collide with any point of the reflective layer 13 corresponding to a short-distance from the light emitting device 21 and any point of the reflective layer 13 corresponding to a long-distance from the light emitting device 21 and then be re-reflected. Thus, the light re-reflected toward the optical sheet 15 may be uniformly distributed onto the entire backlight unit to maintain uniform brightness.

The top surface portion 221 may have an aspheric shape gradually recessed from an outer edge portion in the central direction and rounded upward in a convex shape.

Figure 11:
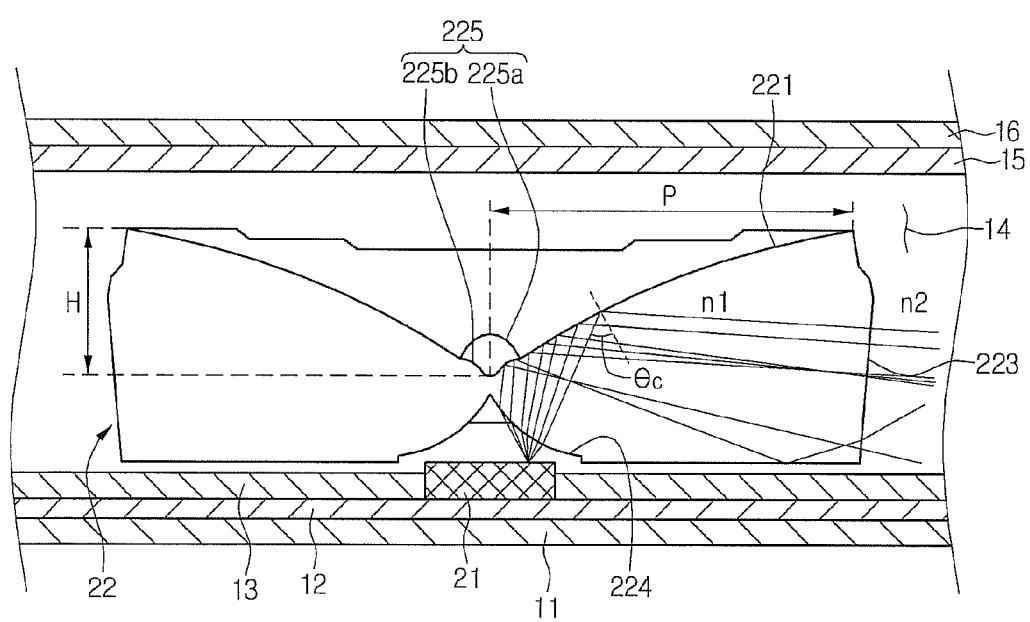
FIG. 11 is a cross-sectional view of a moving path of light occurring on a top surface portion of a lens according to an embodiment.

Also, a top surface center portion 225 is defined on a central area of the top surface portion 221. The top surface center portion 225 includes a recess portion 225a having a general oval shape with a continuous curve or a track-shaped oval shape in which a straight-line section and a curved-line section are connected to each other when viewed from an upper side and recessed downward by a predetermined depth and an uneven portion 225b defining the bottom of the recess portion 225a and having a cross-section with a spread book shape. The uneven portion 225b includes a pair of ridge portions extending from an edge of the recess portion 225 to a central portion and a valley portion disposed on a boundary portion of the pair of ridge portions. Also, a curvature of the ridge portion may be set in a shape in which the valley portion is lower than an outer edge of the ridge portion. Thus, as shown in FIG. 11, a depth H of a central portion of a top surface of the lens 22 may be defined as a vertical length from an upper end of the lens 22 to the valley portion. Also, a pitch P (or a radius) of the top surface of the lens 22 may be defined as a horizontal distance from the valley portion to an edge of the lens 22, i.e., a radius of the lens 22.

Also, as shown in FIGS. 4 to 6, the top surface portion 221 of the lens 22 that is cut by a vertical surface passing through a short axis of the oval defining the recess portion 225a has a shape continuously connected to the ridge portion of the uneven portion 225b. Also, the top surface portion 221 of the lens 22 and the ridge portion constituting the uneven portion 225b may have rounded with the same curvature, or the ridge portion may have a curvature less than that of the top surface portion 221.

A bottom surface center portion 224 recessed upward by a predetermined height is disposed on a bottom surface of the lens 22.

In detail, the bottom surface center portion 224 includes a bottom portion 224a having a general oval shape with a continuous curve or a track-shaped oval shape in which a straight-line section and a curved-line section are connected to each other, a vertical extension portion 224b vertically extending upward from the bottom portion 224a, and a first roof portion 224c roundly extending upward from an end of the vertical extension portion 224b. The first roof portion 224c may extend in a shape of which a transverse width is gradually narrowed toward an upper side. That is, the first roof portion 224c has a prism shape or a lying triangular pillar shape and a smoothly rounded edge. An inclined surface constituting the first roof portion 224c may extend in a curved shape in a direction in which an inner space of the bottom surface center portion is gradually narrowed. For example, the inclined surface may have a convex curvature.

Also, as shown in FIG. 9, a tip of the first roof portion 224c may be spaced a predetermined distance d from the lowest point of the top surface center portion 225, i.e., a valley portion of the uneven portion 225b. When the first roof portion 224c communicates with the valley portion, a hole connecting the top surface center portion 225 of the lens 22 to the bottom surface center portion of the lens 22 is defined. Light emitted through the hole may be emitted onto the optical sheet 15 to cause a hot-spot having luminance significantly greater than that of surrounding luminance. Thus, the recess portions respectively defined in the top surface center portion 225 and the bottom surface center portion of the lens 22 may not communicate with each other.

Also, a second roof portion 224d may be further defined inside the recess portion defined by the vertical extension portion 224b and the first roof portion 224c.

In detail, the second roof portion 224d may extend from any point corresponding between the bottom portion 224a of the bottom surface center portion 224 and the upper end of the vertical extension portion 224b to the tip of the first roof portion 224c. Also, the second roof portion 224d may be roundly extends at a predetermine curvature. Particularly, the second roof portion 224d may extend upward in a rounded shape that is convex in a central direction of a recess space defined by the first roof portion 224c and the vertical extension portion 224b. Thus, the second roof portion 224d may be the other roof portion additionally provided within the first roof portion 224c.

Also, a transverse width (or length) of the second roof portion 224d may be less than a long axis of the oval defining the bottom portion 224a.

A reference symbol X illustrated in FIG. 9 may be defined as a center point of the lens 22. The center point of the lens 22 may also be the center of the recess. That is, the recess on the top and bottom of the lens 22 may be provided at the center of the lens.

Figure 10:
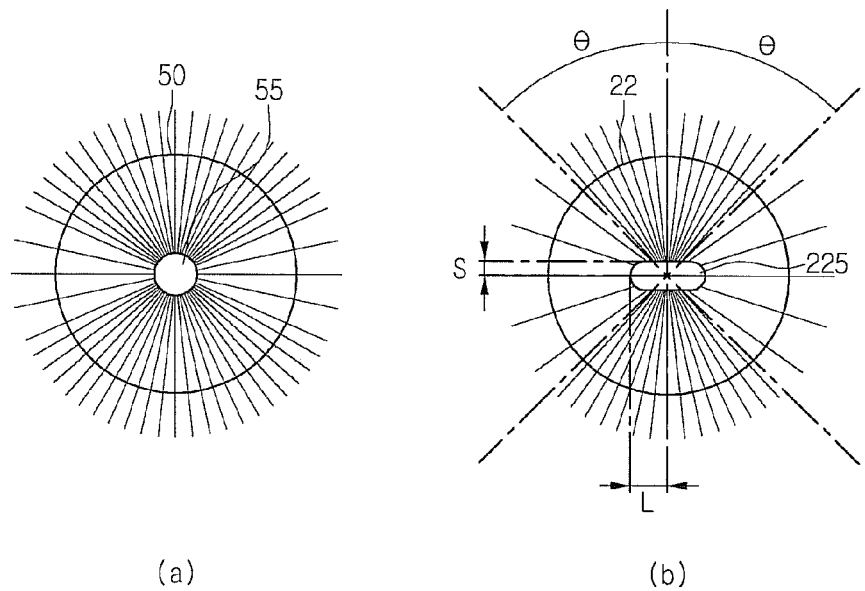
FIG. 10 is a view comparing light reflective index profiles realized in a lens according to a related art and a lens according to an embodiment.

FIG. 10 is a view comparing light reflective index profiles realized in a lens according to a related art and a lens according to an embodiment.

Referring to FIG. 10, as shown in FIG. 10A, in a case of a lens according to a related art, which has a concentric structure in cross-section of the recess portion defined by the bottom surface center portion, it may be confirmed that light horizontally emitted from the light emitting device is not refracted while passing through the lens, but advances straightly. Also, it may be confirmed that light horizontally emitted from the light emitting device is uniformly diffused in a circumferential direction of the lens 22. That is, isotropic light distribution in which light emitted from the light emitting device is uniformly diffused in the circumferential direction may be realized.

On the other hand, as shown in FIG. 10B, in a case where a cross-section of the recess portion defined by the bottom surface center portion has a substantially oval shape, it may be confirmed that anisotropic light distribution in which light emitted from the light emitting device is refracted by a boundary surface between the recess portion and the lens and then concentrated in a specific direction. Here, the substantially oval shape may represent that the oval shape includes the general oval shape connected in a curved shape and the track-shaped oval shape having a straight-line section and a curved section.

In detail, in a case of a lens having the bottom surface center portion with an oval shape, it may be confirmed that light is refracted and concentrated in an extension direction of a short axis of the oval. Particularly, it may be confirmed that anisotropic light distribution in which light emitted from the light emitting device 21 is refracted by a boundary surface between the recess portion defined in the bottom surface center portion 224 and the lens 22, and then the light is concentrated into a fan-shaped area that is spread by a predetermined angle θ in left and right directions with respect to a short axis passing through a center point of the lens 22 is realized. As described above, since the lens has an anisotropic side surface shape, the anisotropic light distribution in which light emitted from the light emitting device 21 is concentrated in a specific direction may be realized, and thus, the light may be diffused far away in a single axis direction. Also, a ratio of a short-axis length to a long-axis length of the oval may be adjusted to adjust an amount of light refracted in the short axis direction and an angle θ spread in the left and right directions with respect to the short axis.

FIG. 11 is a cross-sectional view of a moving path of light occurring on the top surface portion of a lens according to an embodiment.

Referring to FIG. 11, light emitted from the light emitting device 21 is primarily refracted by the boundary surface between the lens 22 and the bottom surface center portion 224. In detail, light emitted from the light emitting device 21 may be refracted in a direction in which the light is concentrated in the short axis direction of the recess portion having the oval shape while passing through the bottom surface center portion 224 of the lens 22.

Also, light passing through the bottom surface center portion 224 to collide with the top surface portion 221 of the lens 22 and a surface of the ridge portion constituting the uneven portion 225b of the top surface center portion 225 may be totally reflected due to a refractive index difference between the lens and air. Also, one portion of the totally reflected light may be horizontally diffused into the light guide layer 14, and the other portion of the light may collide with the reflective layer 13 and then be re-reflected upward.

Here, an angle at which the light colliding with the ridge portion is totally reflected may be different from that at which the light colliding with the top surface portion 221 is totally reflected. Thus, points at which the light totally reflected by the top surface portion 221 of the lens 22 and the uneven portion 225b of the top surface center portion 225 is re-reflected may be uniformly distributed over a short-distance area and a long-distance area from the center of the lens 22. Thus, the brightness of the light may be uniformly maintained.

A totally reflected angle $\theta_c$ of the light colliding with the top surface portion 221 of the lens 22 may be defined by Snell's law as follows:

$\sin \theta_c = (n2/n1)$ (where, n1 is a refractive index of a lens, and n2 is a refractive index of air)

When the lens 22 is formed of polycarbonate, since the polycarbonate has a refractive index of about 1.58, a critical angle $\theta_c$ for total reflection may be about 42 degrees. Thus, the top surface portion 221 may have a curvature so that an angle of incidence of the light incident into the top surface portion 221 may be about 42 degrees or more. Thus, most of light incident into the top surface portion 221 of the lens 22 may be totally reflected and then diffused into the light guide layer. Also, only a portion of the light may pass through the lens 22 to move toward the display panel 15. Here, a light shield pattern layer may be disposed on the top surface of the lens 22 to re-reflect a portion of the light advancing toward the display panel 15 onto the light guide layer.

A degree in which the light incident into the lens 22 is spread in the short axis direction of the bottom surface center portion 224 may be decided by the depth H of the top surface center portion 225/a pitch P of the top surface portion 221 of the lens 22. The pitch P of the top surface portion 221 of the lens 22 may represent a distance from the top surface center portion 225 of the lens 22 to an edge of the top surface portion of the lens 22. Hereinafter, the H/P value that represents the spread degree of the light incident into the lens 22 may be defined as luminous intensity distribution of the lens. A value of the luminous intensity distribution may increase to allow light to be uniformly spread up to a far distance.

According to the result of experiment, it may be confirmed that the more the value of the luminous intensity distribution increases, the more the hot-spot decreases to decrease light losses, whereas the more the value of the luminous intensity distribution decreases, the more the hot-spot increases to increase light losses. Also, if the value of the luminous intensity distribution is about 0.3 or less, the light losses may significantly increase. Thus, the value of the luminous intensity distribution may be about 0.3 or more, particularly, about 0.5.

Figure 12:
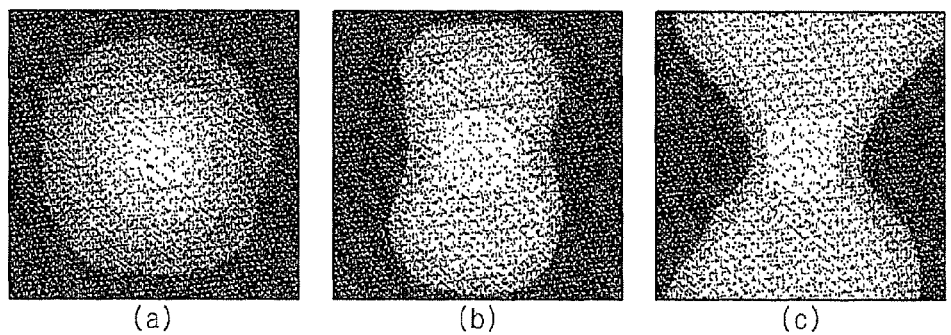
FIG. 12 is a view illustrating light distribution according to a ratio of a long axis length to a short axis length in a recess portion defined in a central portion of a bottom surface of a lens according to an embodiment.

FIG. 12 is a view illustrating light distribution according to a ratio of the long axis length to the short axis length in the recess part defined in the central portion of the bottom surface of the lens according to an embodiment.

Referring to FIG. 12, FIG. 12A illustrates light distribution in a case where a ratio of the long axis/short axis (L/S) of the bottom surface portion of the lens illustrated in FIG. 10A is about 1, i.e., in a case of the recess portion having the concentric shape. Also, FIG. 12B illustrates light distribution when a ratio of the long axis/short axis is about 2, and FIG. 12C illustrates light distribution when a ratio of the long axis/short axis is about 3.

According to the light distribution, it may be confirmed that the more a ratio of the long axis/short axis, light is concentrated into a single axis direction (the short axis direction) and moves up to a far distance. That is to say, it may be confirmed that the more a ratio of the long axis/short axis increases, a diffusion angle θ of light spread in the circumferential direction decreases, and the light is horizontally spread up to a far distance. According to the above-described results, to achieve the anisotropic light distribution that is intended to be realized through the lens according to an embodiment, the lens may be designed so that the ratio of the long axis/short axis of the oval defining the recess portion of the bottom surface center portion is at least 2 or more.

Figure 13:
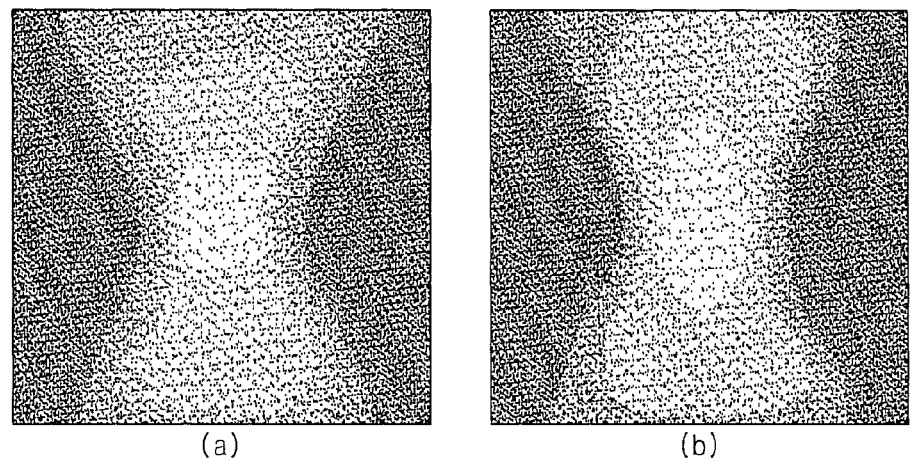
FIG. 13 is a view comparing light distribution occurring in a lens in which an uneven portion is disposed on a central portion thereof according to an embodiment and a lens in which an uneven portion is not provided according to the related art.

FIG. 13 is a view comparing light distribution occurring in a lens in which the uneven part is disposed on the central portion thereof according to an embodiment and a lens in which an uneven part is not provided according to the related art.

Referring to FIG. 13, FIG. 13A illustrates light distribution in a case where the uneven portion 225b is not provided on the top surface portion, and FIG. 13B illustrates light distribution in a case where the uneven portion 225b is provided on the top surface portion.

In detail, in the case where the uneven portion 225b having a specific shape is provided on the top surface of the lens 22, it may be confirmed that an amount of totally reflected and horizontally spread light increases when compared to the case in which the uneven portion 225b is not provided. This represents that the light colliding with the uneven portion 225b is totally reflected to reduce an amount of light straightly advancing toward the optical sheet 15, thereby minimizing generation of the hot-spot. That is to say, a large amount of light emitted from the light emitting device 21 may not be concentrated just above the light emitting device 21, but be spread in the horizontal direction to reduce intensity of the hot-spot.

Also, since the uneven portion 225b has the cross-section with the spread book shape, extends in a long axis direction of the oval constituting the bottom portion 224a of the bottom surface center portion 224, and is disposed within the recess portion 225a having the oval shape, a refraction direction of the light emitted from the light emitting device 21 may be concentrated into a short axis direction of the oval. Thus, when compared to the lens in which the uneven portion 225b is not provided on the top surface portion thereof, the lens 20 according to the current embodiment may have an effect in which the light is spread up to far distance in the short axis direction.

Figure 14:
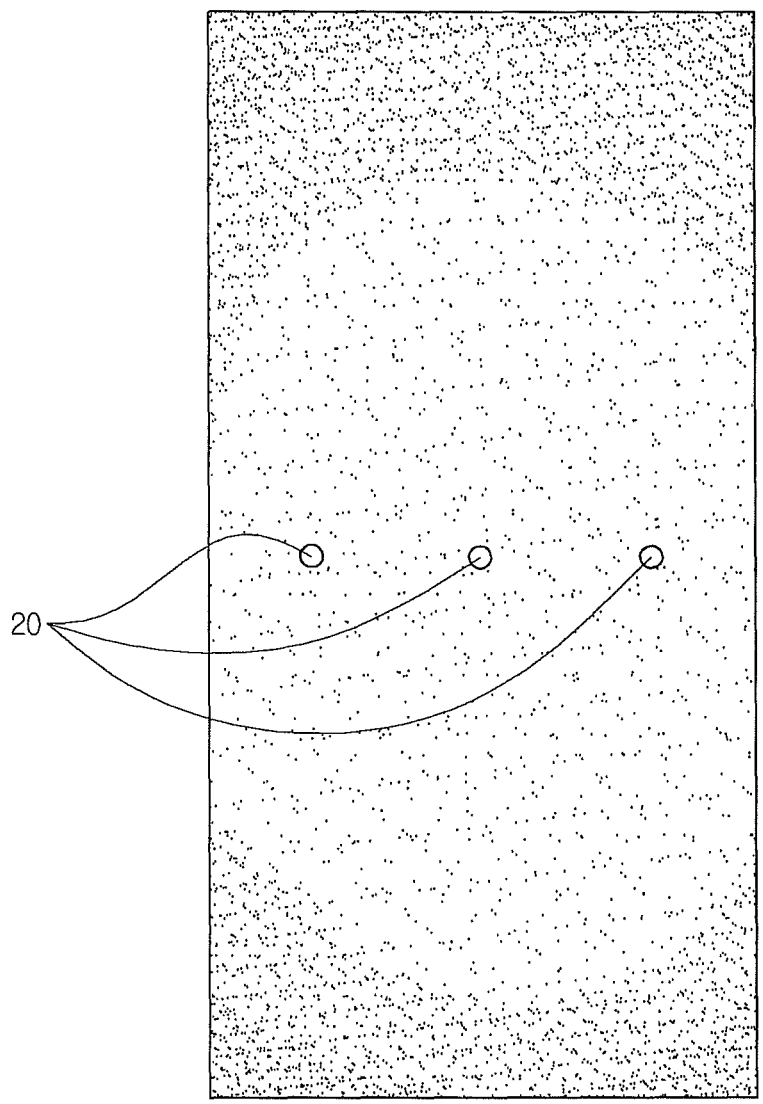
FIG. 14 is a simulation illustrating light distribution in a backlight unit on which a plurality of light emitting parts including a lens are mounted according to an embodiment.

FIG. 14 is a simulation illustrating light distribution in a backlight unit on which a plurality of light emitting parts including the lens are mounted according to an embodiment.

Referring to FIG. 14, the simulation illustrates light distribution in a backlight unit in which three light emitting parts 20 each including the lens according to an embodiment are disposed at a distance of about 60 mm in a length direction of the display panel 16, and an optical gap that represents a thickness of the light guide layer is about 25 mm.

In detail, the length direction of the display panel 16 may represent an arrangement direction of the light emitting parts 20 of FIG. 1. That is, in the display apparatus of FIG. 1, a long side may be defined as a length direction, and a short side may be defined as a width direction. Also, the light emitting parts 20 may be arranged so that the long axis of the oval on the bottom surface center portion of the lens is parallel to the length direction of the display panel 16, and the short axis is parallel to the width direction.

According to the above-described structure, the single light emitting part 20 may have the light distribution illustrated in FIG. 13B, i.e., the light distribution in which a pair of fan shapes is disposed symmetrical to each other. Thus, a plurality of light distribution having the above-described shape may overlap each other on the edge portion to uniformly spread light over an entire surface of the backlight unit. Thus, the brightness of the backlight unit may be uniformly maintained, as well as, the number of mounted light emitting device may be reduced when compared to that of a backlight unit according to the related art to reduce the manufacturing costs. Also, when compared to the backlight unit according to the related art, since the optical gap may be reduced, the backlight unit may be reduced in thickness. Therefore, the display apparatus may be slimmer.

According to the embodiments, the backlight unit may be reduced in thickness, and thus, the display apparatus including the backlight unit may be improved in outer appearance.

Also, the lens structure in which the light emitted from the light emitting device is totally reflected in the downward direction of the side surface may be adopted to the light source provided in the backlight unit to improve the light efficiency and the luminance uniformity. Therefore, the quality of an image displayed on the display apparatus may be improved.

Also, the lens having the anisotropic light distribution structure may be adopted to the top view-type LED package to maximally horizontally total-reflect the light emitted from the light source in the short axis direction, thereby spreading the light up to a far distance. Thus, even though the number of light sources is reduced, the light efficiency and the luminance uniformity may be uniformly maintained.

Also, since a portion of the reflective layer provided on the bottom of the backlight unit is inclinedly designed, the light emitted from the light source may be maximally reflected toward the display panel to improve the light efficiency.

Also, since it is unnecessary to provide a separate member corresponding to the light guide layer, the backlight unit may be reduced in weight, and thus, the display apparatus may be lightweight.

As broadly described and embodied herein, a display apparatus may include a display panel, and a backlight provided adjacent the display panel. The backlight may include an optical sheet provided adjacent the display panel, a reflector provided a prescribed distance from the optical sheet, at least one light emitting device provided adjacent the reflector, and a lens provided over a corresponding the light emitting device. Here, the lens may include a lower recess formed on a bottom surface of the lens and provided a prescribed distance over the light emitting device, and an upper recess formed on a top surface of the lens and provided to vertically overlap the bottom recess.

The lower recess may have an oval shape and may include a side surface that extends vertically from the bottom surface, and a first upper surface that extends from the side surface at a first prescribed angle relative to the side surface, the first upper surface having a convex curvature. The first upper surface extends from the side surface to form a vertex a prescribed distance above the bottom surface. The lower recess may include a second upper surface that extends from the side surface at a second prescribed angle relative to the side surface, and a third upper surface symmetrical to the second upper surface and extending to the second upper surface from an opposite side of the lower recess. Moreover, the second upper surface and the third upper surface may have a concave curvature.

The second upper surface and the third upper surface intersect at a prescribed angle relative to each other parallel to a long axis of the lower recess. The vertex of the first upper surface may be adjacent to the first and second upper surfaces where the first and second surfaces intersect. The first upper surface may extend from the side surface at a first prescribed distance from the bottom surface and the second upper surface may extend from the side surface at a second prescribed distance from the bottom surface. The second prescribed distance may be less than or equal to the first prescribed distance. Moreover, the oval shape of the lower recess may include a rectangular portion and round portions provided at short ends of the rectangular portion, and the first upper surface may extend from the side surface at the round portion and the second and third surfaces may extend from the side surface at the rectangular portion.

A length of the lower recess may be at least twice a width of the lower recess. The top surface of the lens may have a prescribed shape that is convex from an outer circumferential edge to a center of the lens. The top surface may include a plurality of sections corresponding to circular sectors of the lens. Here, adjacent sections of the top surface may have different heights relative to each other. Moreover, the curvature of the top surface may be such that an angle of incidence of light incident on the top surface of the lens from a corresponding light emitting device is greater than or equal to 42°.

The upper recess may have an oval shape and may include a side surface that extends vertically from the top surface of the lens, a first lower surface having a prescribed curvature and extending from the side surface, and a second lower surface which is symmetrical to the first lower surface and extending toward the first lower surface from an opposite side of the upper recess.

The first lower surface and the second lower surface may have concave curvatures. The first and second lower surfaces may intersect at a prescribed angle relative to each other parallel to a long axis of the upper recess. A depth of the upper recess may be greatest where the first and second lower surfaces intersect. A long axis of the lower recess may be parallel to a long axis of the upper recess and provided to vertically overlap each other. Moreover, a ratio of a depth of the upper recess to a radius of the lens may satisfy the condition: $0.3 \leq H/P \leq 0.5$, wherein H is a height from a top of the lens to a lowermost point in the upper recess, and P is the radius of the lens.

In one embodiment, a display apparatus may include a display panel, a light emitting device, a reflector provided adjacent to the light emitting device, and a lens provided a prescribed distance over the light emitting device and configured to distribute light to illuminate the display panel. The lens may include a recess having an oval shape provided on a bottom surface of the lens. The recess may include a side surface that extends vertically a prescribed distance from the bottom surface, and an upper surface that extends from the side surface and having a convex curvature, wherein a width of the upper surface gradually decreases into the recess.

In one embodiment, a display apparatus may include a board, a light emitting part comprising a light emitting device mounted on the board and a lens disposed above the light emitting device, a reflective layer disposed on a top surface of the board, an optical sheet disposed above the reflective layer at a height spaced apart from the light emitting part, and a display panel disposed on a top surface of the optical sheet. Here, the lens may include a bottom portion having a cross-section with an oval shape, a vertical extension portion recessed and extending by a predetermined length upward from the bottom portion, and a bottom surface center portion comprising a first roof portion inclinedly received in a shape that is gradually narrowed upward from an end of the vertical extension portion.

The display apparatus may include an edge of the first roof portion is smoothly rounded. An inclined surface may include the first roof portion extends in a curved shape in a direction in which an inner space of the bottom surface center portion is gradually narrowed. The display apparatus may further include a second roof portion protruding to an inner space defined by the vertical extension portion and the first roof portion, the second roof portion connecting a tip of the first roof portion at any point of the vertical extension portion. The display apparatus may include an inclined surface constituting the second roof portion is curved in a direction in which the second roof portion protrudes to the inner space. The tip of the first roof portion may have a length (or a width) less than a long axis length of the bottom portion. Moreover, a ratio of a long axis/short axis of the bottom portion may be about 2 or more.

The lens may include a top surface portion having an aspherical surface with a parabola shape that is gradually higher outward from a center thereof and having an outer line with a concentric shape. The top surface portion may be partitioned into a plurality of sections in a circumferential direction, and the adjacent sections may have stepped with respect to each other so that the adjacent sections a height difference therebetween.

The lens may include a recess portion recessed by a predetermined depth with a cross-section having an oval shape in a central area of the top surface portion and a top surface center portion comprising an uneven portion disposed on a bottom of the recess portion. The uneven portion may include a pair of ridge portions curved upward and a valley portion disposed between the pair of ridge portions. The valley portion may extend in a long axis direction of the oval constituting the recess portion. The uneven portion may have a cross-section with a spread book shape, and the valley passing through a center of the uneven portion may extend in a long axis direction of the oval constituting the recess portion.

The center of the uneven portion may be recessed by a predetermined depth from a tip of the first roof part. A long axis of the oval constituting the bottom portion and the long axis of the oval constituting the recess portion of the top surface center portion may extend in parallel to each other.

A ratio of a depth of the top surface center portion of the lens to a radius of the lens may satisfy a following condition $0.3 \leq H/P \leq 0.5$ (where, H is the depth of the top surface center portion of the lens, and P is the radius of the lens). The top surface portion of the lens may be rounded in a convex shape with a curvature so that incident light has an incident angle of about 42 degrees or more.

At least one portion of the reflective layer may be inclined in a direction in which the reflective layer is higher toward an edge thereof. A space between the reflective layer and the optical sheet may be an air layer or a vacuum layer.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A display apparatus comprising:
a display panel; and
a backlight provided adjacent the display panel, wherein the backlight includes
an optical sheet provided adjacent the display panel,
a reflector provided a prescribed distance from the optical sheet,
at least one light emitting device provided adjacent the reflector, and
a lens provided over a corresponding the light emitting device,
wherein the lens includes
a lower recess formed on a bottom surface of the lens and provided a prescribed distance over the light emitting device, and
an upper recess formed on a top surface of the lens and provided to vertically overlap the bottom recess,
wherein the lower recess has an oval shape and includes
a side surface that extends vertically from the bottom surface, and
a first upper surface that extends from the side surface at a first prescribed angle relative to the side surface, the first upper surface having a convex curvature.

2. The display apparatus of claim 1, wherein the first upper surface extends from the side surface to form a vertex a prescribed distance above the bottom surface.

3. The display apparatus of claim 2, wherein the lower recess includes
a second upper surface that extends from the side surface at a second prescribed angle relative to the side surface, and
a third upper surface symmetrical to the second upper surface and extending to the second upper surface from an opposite side of the lower recess.

4. The display apparatus of claim 3, wherein the second upper surface and the third upper surface have a concave curvature.

5. The display apparatus of claim 4, wherein the second upper surface and the third upper surface intersect at a prescribed angle relative to each other parallel to a long axis of the lower recess.

6. The display apparatus of claim 5, wherein the vertex of the first upper surface is adjacent to the first and second upper surfaces where the first and second surfaces intersect.

7. The display apparatus of claim 3, wherein the first upper surface extends from the side surface at a first prescribed distance from the bottom surface and the second upper surface extends from the side surface at a second prescribed distance from the bottom surface, the second prescribed distance being less than or equal to the first prescribed distance.

8. The display apparatus of claim 4, wherein the oval shape of the lower recess includes a rectangular portion and round portions provided at short ends of the rectangular portion, and
wherein the first upper surface extends from the side surface at the round portion and the second and third surfaces extend from the side surface at the rectangular portion.

9. The display apparatus of claim 1, wherein a length of the lower recess is at least twice a width of the lower recess.

10. The display apparatus of claim 1, wherein the top surface of the lens has a prescribed shape that is convex from an outer circumferential edge to a center of the lens.

11. The display apparatus of claim 10, wherein the top surface includes a plurality of sections corresponding to circular sectors of the lens, and wherein adjacent sections have different heights relative to each other.

12. The display apparatus according to claim 10, wherein the curvature of the top surface is such that an angle of incidence of light incident on the top surface of the lens from a corresponding light emitting device is greater than or equal to 42°.

13. A display apparatus comprising:
a display panel; and
a backlight provided adjacent the display panel, wherein the backlight includes
an optical sheet provided adjacent the display panel,
a reflector provided a prescribed distance from the optical sheet, at least one light emitting device provided adjacent the reflector, and a lens provided over a corresponding the light emitting device, wherein the lens includes a lower recess formed on a bottom surface of the lens and provided a prescribed distance over the light emitting device, and an upper recess formed on a top surface of the lens and provided to vertically overlap the bottom recess, wherein the upper recess has an oval shape and includes a side surface that extends vertically from the top surface of the lens, a first lower surface having a prescribed curvature and extending from the side surface, and a second lower surface which is symmetrical to the first lower surface and extending toward the first lower surface from an opposite side of the upper recess.

14. The display apparatus of claim 13, wherein the first lower surface and the second lower surface have concave curvatures.

15. The display apparatus of claim 13, wherein the first and second lower surfaces intersect at a prescribed angle relative to each other parallel to a long axis of the upper recess.

16. The display apparatus according to claim 15, wherein a depth of the upper recess is greatest where the first and second lower surfaces intersect.

17. The display apparatus according to claim 13, wherein a long axis of the lower recess is parallel to a long axis of the upper recess and provided to vertically overlap each other.

18. A display apparatus comprising:

a display panel; and a backlight provided adjacent the display panel, wherein the backlight includes an optical sheet provided adjacent the display panel, a reflector provided a prescribed distance from the optical sheet, at least one light emitting device provided adjacent the reflector, and a lens provided over a corresponding the light emitting device, wherein the lens includes a lower recess formed on a bottom surface of the lens and provided a prescribed distance over the light emitting device, and an upper recess formed on a top surface of the lens and provided to vertically overlap the bottom recess, wherein a ratio of a depth of the upper recess to a radius of the lens satisfies a following condition:

$0.3 \leq H/P \leq 0.5$, wherein H is a height from a top of the lens to a lowermost point in the upper recess, and P is the radius of the lens.

19. A display apparatus comprising:

a display panel;

a light emitting device;

a reflector provided adjacent to the light emitting device; and a lens provided a prescribed distance over the light emitting device and configured to distribute light to illuminate the display panel, wherein the lens includes a recess having an oval shape provided on a bottom surface of the lens, the recess including a side surface that extends vertically a prescribed distance from the bottom surface, and an upper surface that extends from the side surface and having a convex curvature, wherein a width of the upper surface gradually decreases into the recess.

* * * * *